(12) United States Patent
Hong

(10) Patent No.: US 9,577,215 B2
(45) Date of Patent: Feb. 21, 2017

(54) DISPLAY DEVICE WITH GLASS FRIT SEALING PORTION

(71) Applicant: Samsung Display Co., Ltd., Yongin, Gyeonggi-do (KR)

(72) Inventor: Sangmin Hong, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/562,993

(22) Filed: Dec. 8, 2014

(65) Prior Publication Data

US 2016/0013441 A1 Jan. 14, 2016

(30) Foreign Application Priority Data

Jul. 9, 2014 (KR) ........................ 10-2014-0086152

(51) Int. Cl.
*H01L 51/52* (2006.01)
*H01L 27/32* (2006.01)

(52) U.S. Cl.
CPC ...... *H01L 51/5246* (2013.01); *H01L 27/3276* (2013.01); *H01L 51/525* (2013.01)

(58) Field of Classification Search
CPC .................................... H01L 51/0545
USPC .............................. 257/40; 438/28
See application file for complete search history.

(56) References Cited

U.S. PATENT DOCUMENTS

| 8,049,412 B2 | 11/2011 | Kwak |
| 2006/0139505 A1 | 6/2006 | Yoshinaga |
| 2007/0080905 A1* | 4/2007 | Takahara ............ G09G 3/3233 345/76 |
| 2010/0163859 A1* | 7/2010 | Yamazaki ........... H01L 21/6835 257/40 |
| 2011/0134056 A1 | 6/2011 | Kim et al. |
| 2011/0272714 A1 | 11/2011 | Lhee |
| 2012/0043880 A1 | 2/2012 | Lee |
| 2014/0027743 A1 | 1/2014 | Nishido |
| 2014/0166994 A1* | 6/2014 | Xiong ................. H01L 51/5246 257/40 |
| 2014/0233086 A1* | 8/2014 | Oberst .................... B81B 7/007 359/291 |
| 2016/0155993 A1* | 6/2016 | Nishido ................ H05B 33/04 438/26 |

FOREIGN PATENT DOCUMENTS

| JP | 2006-178368 | 7/2006 |
| KR | 10-2008-0051788 | 6/2008 |
| KR | 10-0897157 B | 5/2009 |
| KR | 2011-0062469 | 6/2011 |
| KR | 2011-0123123 | 11/2011 |
| KR | 2012-0017928 | 2/2012 |
| KR | 2014-0016170 | 2/2014 |

* cited by examiner

*Primary Examiner* — John P Dulka
(74) *Attorney, Agent, or Firm* — Knobbe Martens Olson & Bear LLP

(57) ABSTRACT

A display device includes: a substrate on which a display is formed; an encapsulation portion covering the substrate; and a sealing portion arranged between the substrate and the encapsulation portion and surrounding the display, wherein at least one power wire passes between the substrate and the encapsulation portion, and wherein a metal layer is formed between the sealing portion and the at least one power wire.

19 Claims, 4 Drawing Sheets

DISPLAY DEVICE WITH GLASS FRIT SEALING PORTION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2014-0086152, filed on Jul. 9, 2014, in the Korean Intellectual Property Office, the disclosure of which is incorporated herein in its entirety by reference.

BACKGROUND

Field

One or more embodiments relate to a display device.

Description of the Related Technology

In general, a display device such as an organic light-emitting display device (OLED) may be used in a mobile device such as a smartphone, a tablet personal computer (PC), a laptop computer, a digital camera, a camcorder, or portable information terminal, or an electronic and electrical product such as an ultra-thin television, among others.

The display device should be sealed to protect a display that displays an image. Thus, a sealing member is typically disposed between upper and lower substrates of the display device and then hardened to couple the upper and lower substrates by applying energy to the sealing member.

It is desired to reduce an unnecessary area, for example, a dead space within the display device while manufacturing the same. Furthermore, a structural strength of a sealed area should be maintained.

SUMMARY OF CERTAIN INVENTIVE ASPECTS

One or more embodiments include a display device.

Additional aspects will be set forth in part in the description which follows and, in part, will be apparent from the description, or may be learned by practice of the presented embodiments.

According to one or more embodiments, a display device includes: a substrate; a display formed on the substrate; an encapsulation portion covering the substrate; and a sealing portion arranged between the substrate and the encapsulation portion and surrounding the display, wherein at least one power wire passes between the substrate and the encapsulation portion, and wherein a metal layer is formed between the sealing portion and the at least one power wire.

A plurality of openings may be formed on a portion of the at least one power wire that corresponds to the sealing portion, and an insulating member may be formed in the plurality of openings.

The metal layer may cover the insulating member.

The metal layer may be formed on a location corresponding to a location where the insulating member is formed.

The at least one power wire may directly contact at least one portion of the metal layer.

The substrate may include an active area where the display is formed, a circuit area extended outside the active area, and a cell seal area extended outside the circuit area. A circuit wire that is electrically connected to the active area may be formed in the circuit area, and the at least one power wire may be electrically connected to the circuit wire and receives external power.

The at least one power wire may pass a sealing area from the circuit area and may be extended to an edge of the substrate.

The at least one power wire may be arranged on a different layer from the circuit wire, and at least some portions of the at least one power wire may overlap the circuit wire.

The display may include: at least one thin film transistor (TFT) including a semiconductor active layer, at least one gate electrode, at least one source electrode, and at least one drain electrode; and an organic light-emitting display device (OLED) electrically connected to the at least one TFT and including a first electrode, an intermediate layer, and a second electrode. The at least one power wire may include the same material as the at least one source electrode and the at least one drain electrode.

The metal layer may include the same material as the first electrode.

An insulating layer may be formed between the semiconductor active layer, the at least one gate electrode, the at least one source electrode, and the at least one drain electrode in order to insulate the same.

At least one gate wire may pass a lower portion of the sealing portion.

The at least one gate wire may be arranged on a different layer due to the insulating layer.

The at least one power wire may directly contact at least some portions of the metal layer.

A reinforcement member may be further formed outside the sealing portion.

According to one or more embodiments a method of manufacturing a display device includes: forming a substrate; forming a display on the substrate; covering the substrate with an encapsulation portion; and arranging a sealing portion between the substrate and the encapsulation portion and surrounding the display, wherein at least one power wire passes between the substrate and the encapsulation portion, and wherein a metal layer is formed between the sealing portion and the at least one power wire.

The at least one power wire may directly contact at least some portions of the metal layer.

The method of manufacturing may further include forming a reinforcement member outside the sealing portion.

The method of manufacturing may further include forming a plurality of openings on a portion of the at least one power wire that corresponds to the sealing portion, and forming an insulating member in the plurality of openings.

The display may include: at least one thin film transistor (TFT) comprising a semiconductor active layer, a gate electrode, a source electrode, and a drain electrode; and an organic light-emitting display device (OLED) electrically connected to the at least one TFT and comprising a first electrode, an intermediate layer, and a second electrode, and wherein the at least one power wire includes the same material as the source electrode and the drain electrode.

BRIEF DESCRIPTION OF THE DRAWINGS

These and/or other aspects will become apparent and more readily appreciated from the following description of certain embodiments, taken in conjunction with the accompanying drawings in which.

DETAILED DESCRIPTION OF CERTAIN INVENTIVE EMBODIMENTS

Figure 1:
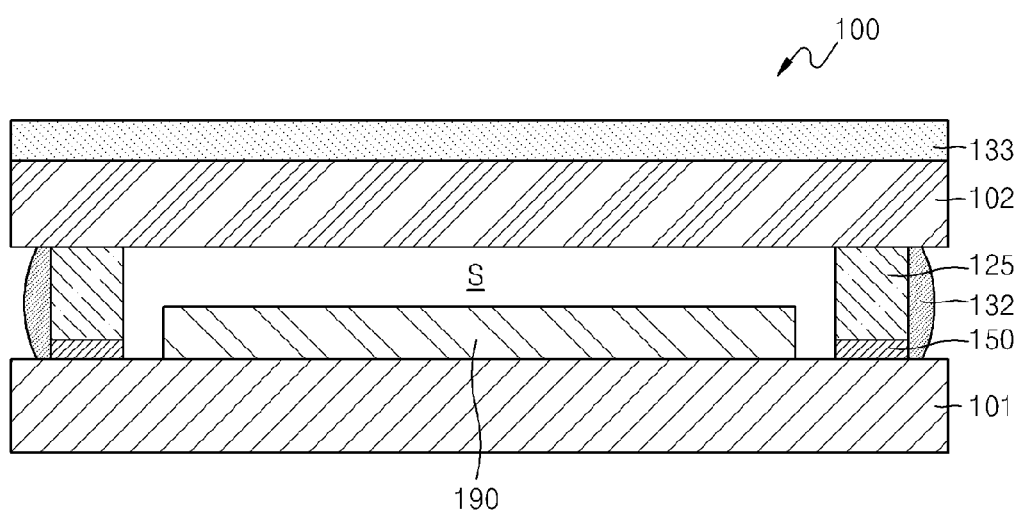
FIG. 1 is a schematic diagram of a display device according to an embodiment.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description, certain detailed explanations of the related art are omitted when it is deemed that they may unnecessarily obscure the essence of the disclosure.

While such terms as "first," "second," and the like may be used to describe various components, such components are not limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, certain embodiments of a display device will be described more fully with reference to the accompanying drawings. Like reference numerals in the drawings generally denote like elements, and repeated descriptions thereof will be omitted.

Figure 2:
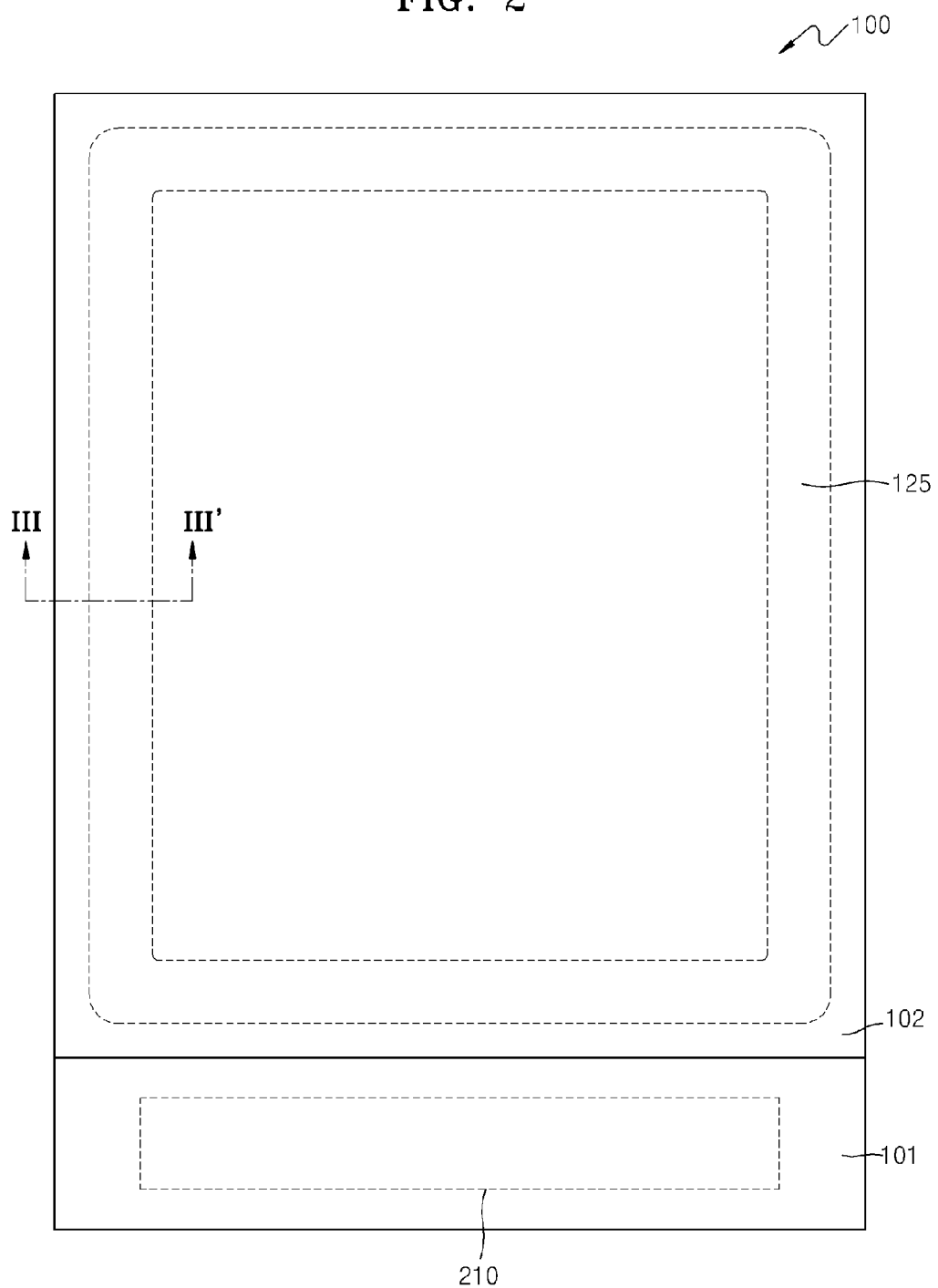
FIG. 2 is a schematic plan view of the display device of FIG. 1.

FIG. 1 is a schematic diagram of a display device 100 according to an embodiment, and FIG. 2 is a schematic plan view of the display device 100 of FIG. 1.

The display device 100 is described by explaining an organic light-emitting display device (OLED), but is not limited to a display device that displays an image after power is applied, for example, the description also applies to a liquid crystal display device (LCD), a field emission display device (FED), an electronic paper display device (EPD), and the like.

Referring to FIGS. 1 and 2, the display device 100 includes a substrate 101 and an encapsulation portion 102 disposed above the substrate 101.

The substrate 101 may be a glass substrate having rigidity, a polymer substrate, a flexible film, a metal substrate, or a combination thereof. The encapsulation portion 102 may be a glass substrate, a resin substrate, a flexible film, or a thin film in which organic layers and inorganic layers are alternately stacked. A display 190 that displays an image is arranged on the substrate 101.

A sealing portion 125 may be arranged between the substrate 101 and the encapsulation portion 102. The sealing portion 125 is formed along edges of the substrate 101 and the encapsulation portion 102. The sealing portion 125 surrounds the display 190.

The sealing portion 125 may include a material that is melted when a predetermined amount of heat energy is applied. The sealing portion 125 may include a material that is hardened by laser. For example, the sealing portion 125 may include glass frit.

At least one wire 150 may pass between the sealing portion 125 and the substrate 101. The at least one wire 150 may include a power wire or a signal wire such as, for example, a gate wire.

A reinforcement member 132 may be further formed outside the sealing portion 125. The reinforcement member 132 is used to reinforce adhesion strength of the sealing portion 125 and includes an adhesive material. The reinforcement member 132 may include an organic sealant such as, for example, urethane-based resin, epoxy-based resin or acryl-based resin, or an inorganic sealant such as, for example, silicone.

A moisture absorption member or filler may be arranged within a space S that is sealed by the substrate 101, the encapsulation portion 102, and the sealing portion 125.

An integrated circuit (IC) 210 (see FIG. 2) may be mounted in an edge of the substrate 101, which is not covered by the encapsulation portion 102.

A functional film 133 that performs various functions may be formed on the encapsulation portion 102. For example, the functional film 133 may include one or more of a polarizing plate, a touch screen and a cover window.

When the functional film 133 includes the touch screen, the touch screen may have a structure in which a touch screen pattern is directly formed on the encapsulation portion 102, for example, an on-cell touch screen panel. The polarizing plate prevents external light from being reflected from the display 190. The cover window protects the display 190.

In the display device 100, a dead space, which is an area that is not related to the display 190 displaying an image, is desirably decreased. For example, a width of a sealing area where the sealing portion 125 is formed can be decreased, or a margin of a cutting area where a plurality of display devices 100 are separated from each other can be decreased. If the width of the sealing portion 125 is reduced, adhesion between the substrate 101 and the encapsulation portion 102 may be weakened.

The wire 150 passes a lower portion of the sealing portion 125. The wire 150 may directly contact the sealing portion 125. Therefore, adhesion between the wire 150 and the sealing portion 125 is desirably strengthened.

In one embodiment, an element that reinforces structural strength may be arranged on the sealing area in order to decrease the dead space and strengthen the adhesion between the substrate 101 and the encapsulation portion 102.

Figure 3:
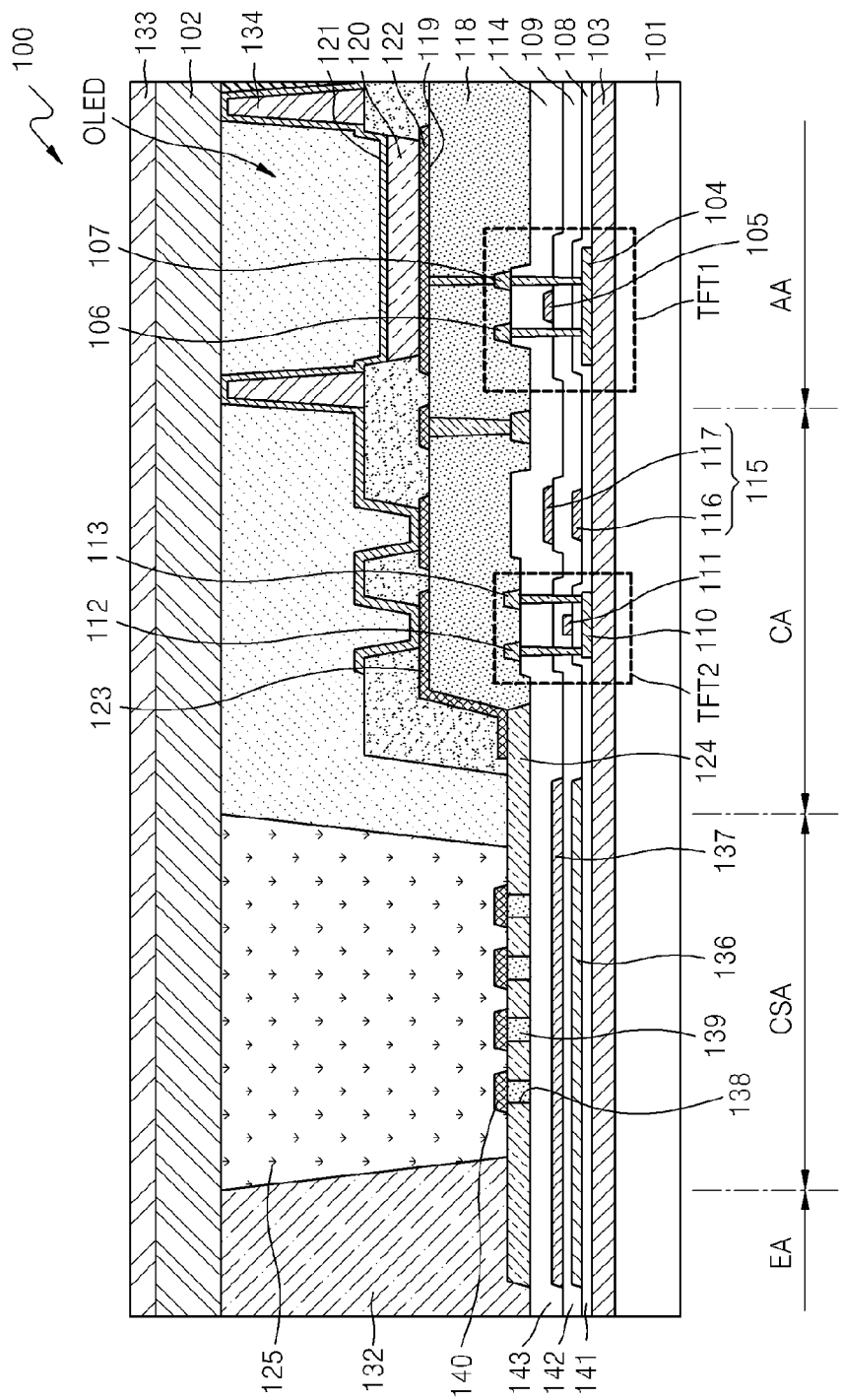
FIG. 3 is a cross-sectional view taken along a line of the display device of FIG. 2.
Figure 4:
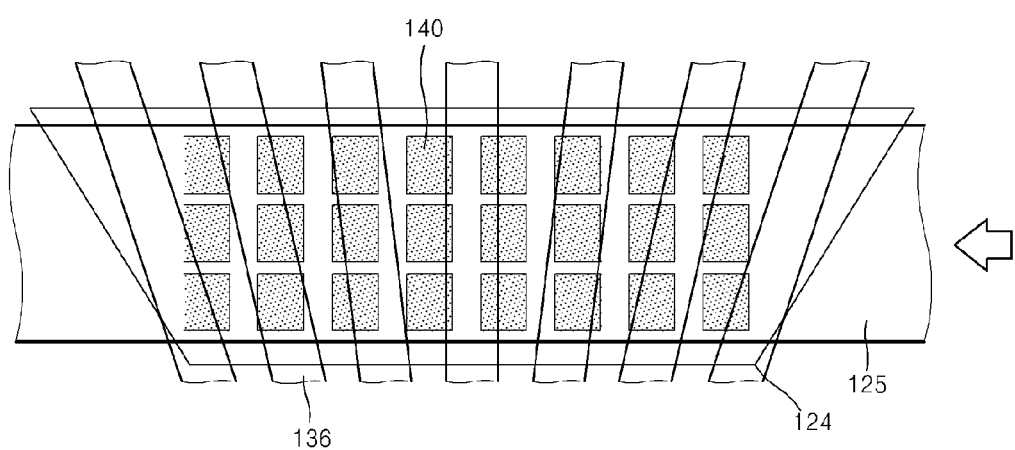
FIG. 4 is an enlarged plan view of an area where a sealing portion of FIG. 3 is formed.

FIG. 3 is a cross-sectional view taken along a line of the display device 100 of FIG. 2, and FIG. 4 is an enlarged plan view of an area where a sealing portion 125 of FIG. 3 is formed.

Referring to FIGS. 3 and 4, the display device 100 includes the substrate 101 and the encapsulation portion 102 disposed above the substrate 101.

The substrate 101 includes an active area AA, a circuit area CA extended outside the active area AA, and a cell seal area CSA extended outside the circuit area CA.

The active area AA includes an area where an image is displayed, and the circuit area CA includes an area where a circuit pattern layer transmitting electrical signals to devices of the active area AA is formed. The cell seal area CSA includes an area where the substrate 101 and the encapsulation portion 102 are sealed.

The substrate 101 may be a glass substrate, a polymer substrate, a flexible film, a metal substrate, or a combination thereof. The substrate 101 may be transparent, opaque or translucent.

A buffer layer 103 may be formed on the substrate 101. The buffer layer 103 flattens a surface of the substrate 101 and prevents moisture and oxygen from penetrating inside. The buffer layer 103 may include an inorganic layer including, for example, silicon oxide, or an organic layer including, for example, polyimide, or have a structure in which inorganic layers and organic layers are stacked.

At least one thin film transistor (TFT) is formed in each of the active area AA and the circuit area CA. Alternatively, a plurality of TFTs may be formed in each of the active area AA and the circuit area CA. In one embodiment, a case where TFTs that are different types are arranged in each of the active area AA and the circuit area CA will be described. However, the present invention is not limited thereto.

A first TFT1 arranged on the active area AA includes a first semiconductor active layer 104, a first gate electrode 105, a first source electrode 106, and a first drain electrode 107. A first gate insulating layer 108 and a second gate insulating layer 109 are arranged between the first semiconductor active layer 104 and the first gate electrode 105 in order to insulate the same.

A second TFT2 arranged on the circuit area CA includes a second semiconductor active layer 110, a second gate electrode 111, a second source electrode 112, and a second drain electrode 113. The first gate insulating layer 108 is arranged between the second semiconductor active layer 110 and the second gate electrode 111 in order to insulate the same.

When the first TFT1 and the second TFT2 are compared, the first TFT1 further includes the second gate insulating layer 109 arranged between the first semiconductor active layer 104 and the first gate electrode 105. The first TFT1 has a gate insulating layer that is thicker than that of the second TFT2. When a TFT has a thick gate insulating layer, a driving range of a gate voltage applied to a gate electrode may be widened.

The first TFT1 may be a driving thin film transistor (DTFT) that drives an OLED. An increased driving range of the DTFT means that light emitted from the OLED may be controlled to have abundant gradation.

The first gate electrode 105 and the second gate electrode 111 are not arranged in the same layer. Accordingly, although the first TFT1 and the second TFT2 are closely arranged, no interference occurs so that an increased number of devices may be arranged in the same area.

The first semiconductor active layer 104 and the second semiconductor active layer 110 may be formed on the buffer layer 103. The first semiconductor active layer 104 and the second semiconductor active layer 110 may include an inorganic semiconductor such as, for example, amorphous silicon or poly silicon or an organic semiconductor. The first semiconductor active layer 104 and the second semiconductor active layer 110 may include an oxide semiconductor. For example, the oxide semiconductor includes oxide of any element selected from the group consisting of groups 4, 12, 13 and 14 metal elements such as zinc (Zn), indium (In), gallium (Ga), tin (Sn), cadmium (Cd), germanium (Ge), hafnium (Hf) and combinations thereof.

The first gate insulating layer 108 is arranged on the buffer layer 103 and covers the first semiconductor active layer 104 and the second semiconductor active layer 110.

The second gate electrode 111 is arranged on the first gate insulating layer 108 and may overlap a portion of the second semiconductor active layer 110.

The second gate insulating layer 109 covers the second gate electrode 111.

The first gate electrode 105 is formed on the second gate insulating layer 109 and may overlap a portion of the first semiconductor active layer 104.

The first gate electrode 105 and the second gate electrode 111 are formed as a single layer or multiple layers including gold (Au), silver (Ag), copper (Cu), nickel (Ni), platinum (Pt), palladium (Pd), aluminum (Al), molybdenum (Mo), chromium (Cr), etc. or may include alloys such as Al:Nd and Mo:W.

The first gate insulating layer 108 and the second gate insulating layer 109 include inorganic layers formed of silicon oxide, silicon nitride, or metal oxide. The first gate insulating layer 108 and the second gate insulating layer 109 may be formed as a single layer or multiple layers.

An interlayer insulating layer 114 covers the first gate electrode 105. The interlayer insulating layer 114 may include an inorganic layer including silicon oxide, silicon nitride, or the like. The interlayer insulating layer 114 may include an organic layer including, for example, polyimide.

The first source electrode 106 and the first drain electrode 107 are formed on the interlayer insulating layer 114 and contact the first semiconductor active layer 104 through contact holes. In addition, the second source electrode 112 and the second drain electrode 113 are formed on the interlayer insulating layer 114 and contact the second semiconductor active layer 110 through contact holes.

The first source electrode 106, the second source electrode 112, the first drain electrode 107, and the second drain electrode 113 include metals, alloys, metal nitride, conductive metal oxide, transparent conductive materials, and the like.

A structure of the TFT is not limited thereto and may vary. For example, the TFT has a top gate structure, but may have a bottom gate structure in which the first gate electrode 105 is arranged on a lower portion of the first semiconductor active layer 104.

A capacitor 115 may be formed in the circuit area CA. A plurality of capacitors may be formed in the active area AA.

The capacitor 115 includes a first capacitor 116, a second capacitor 117, and the second gate insulating layer 109 disposed therebetween. The first capacitor 116 may include the same material as the second gate electrode 111, and the second capacitor 117 may include the same material as the first gate electrode 105.

A planarization layer 118 covers the first TFT1, the second TFT2, and the capacitor 115. The planarization layer 118 is formed on the interlayer insulating layer 114. The planarization layer 118 removes a step difference of thin films in order to increase emission efficiency of the OLED that may be formed on the planarization layer 118, and flattens the OLED. The planarization layer 118 may have a through hole exposing a portion of the first drain electrode 107.

The planarization layer 118 may include insulating materials. For example, the planarization layer 118 may have a single-layer or multilayer structure including inorganic layers, organic layers or combinations thereof and may be formed by various deposition methods.

The planarization layer 118 may include organic materials such as, for example, polyacrlates resin, epoxy resin and benzocyclobutene (BCB), or inorganic materials such as, for example, silicon nitride (SiNx).

Any one of the planarization layer 118 and the interlayer insulating layer 114 may optionally not be formed.

The OLED is formed on the planarization layer 118. The OLED includes the first electrode 119, an intermediate layer 120, and the second electrode 121.

A pixel defining layer 122 covers the planarization layer 118 and a portion of the first electrode 119, and defines a pixel area PA and a non-pixel area NPA (not shown).

The pixel defining layer 122 may include organic or inorganic materials. For example, the pixel defining layer 122 may include organic materials such as, for example, polyimide, polyamide, BCB, polyacrlates resin and phenol resin, or inorganic materials such as, for example, SiNx. The pixel defining layer 122 may be formed as a single layer or multiple layers.

Holes and electrons respectively injected from the first electrode 119 and the second electrode 121 are combined in the intermediate layer 120 and then emit light.

The intermediate layer 120 includes an emissive layer. As another example, the intermediate layer 120 includes an emissive layer and may further include at least one of a hole injection layer (HIL), a hole transport layer (HTL), an electron transport layer (ETL), and an electron injection layer (EIL). However, the embodiments are not limited thereto, and the intermediate layer 120 includes an emissive layer and may further include various functional layers.

The second electrode 121 may be formed on the intermediate layer 120. The second electrode 121 forms an electric field with the first electrode 119 and allows the intermediate layer 120 to emit light. The first electrode 119 may be patterned in each pixel, and the second electrode 121 may be formed to apply a common voltage to every pixel.

The first electrode 119 and the second electrode 121 may include transparent electrodes and reflective electrodes.

The first electrode 119 functions as an anode and may include diverse conductive materials. The first electrode 119 may be a transparent electrode or a reflective electrode.

For example, when the first electrode 119 is a transparent electrode, the first electrode 119 includes a transparent conductive film including indium tin oxide (ITO), indium zinc oxide (IZO), zinc oxide (ZnO), indium oxide ($In_2O_3$), or the like. When the first electrode 119 is a reflective electrode, the first electrode 119 forms a reflective film including Ag, Mg, Al, Pt, Pd, Au, Ni, Nd, Ir, Cr or combinations thereof, and then forms a transparent conductive film including ITO, IZO, ZnO, $In_2O_3$, or the like, above the reflective film.

The second electrode 121 may function as a cathode. The second electrode 121 may be a transparent electrode or a reflective electrode, like the first electrode 119.

For example, when the second electrode 121 is a transparent electrode, metals having a small work function, for example, Li, Ca, LiF/Ca, LiF/Al, Al, Mg, and combinations thereof may be deposited on the intermediate layer 120. Then, a transparent conductive film including, for example, ITO, IZO, ZnO, $In_2O_3$, or the like may be further formed on the metals and combinations thereof. When the second electrode 121 is a reflective electrode, the second electrode 121 may include Li, Ca, LiF/Ca, LiF/Al, Al, Mg, and combinations thereof.

The first electrode 119 and the second electrode 121 may function as an anode and a cathode, respectively, but are not limited thereto. For example, the first electrode 119 may function as a cathode, and the second electrode 121 may function as an anode.

Each of the OLEDs may have one pixel, and each pixel may have a red, green, blue, or white color. However, embodiments are not limited thereto. Regardless of a location of each pixel, the intermediate layer 120 may be commonly formed on the entire surface of the first electrode 119. In this regard, an emissive layer may be formed, for example, by vertically stacking layers including emissive materials that emit red, green, and blue colors of light or by mixing emissive materials that emit red, green, and blue colors of light. If an emissive material may emit white color of light, other colors of light may be combined. The intermediate layer 120 may further include a color conversion layer that converts the emitted white color of light into another color of light, or a color filter.

A protection layer (not shown) may be arranged on the second electrode 121. The protection layer covers the OLED. The protection layer may include an inorganic insulating layer and/or an organic insulating layer.

A spacer 134 may be arranged in the non-pixel area NPA. The spacer 134 is arranged between the substrate 101 and the encapsulation portion 102. The spacer 134 may maintain a distance between the substrate 101 and the encapsulation portion 102. The spacer 134 may be installed to prevent degradation of display properties which results from external impact.

The spacer 134 may be formed on the pixel defining layer 122. The spacer 134 may protrude toward the encapsulation portion 102 from the pixel defining layer 122. The pixel defining layer 122 and the spacer 134 may be formed by a photo process or a photo etching method by using photosensitive materials and then may be combined. Through a light exposure process, the pixel defining layer 122 and the spacer 134 may be simultaneously formed by using a half-tone mask to adjust the exposure amount of light.

The second electrode 121 and/or the protection layer (not shown) may be arranged above the spacer 134.

The encapsulation portion 102 is coupled to the substrate 101. The encapsulation portion 102 protects the OLED and other thin films from external moisture and oxygen.

The encapsulation portion 102 may be a glass substrate having rigidity, a polymer substrate, or a flexible film. The encapsulation portion 102 may have a structure in which organic layers and inorganic layers are alternately stacked.

A functional film 133 may be formed on the encapsulation portion 102. The functional film 133 includes at least one of a polarizing plate, a touch screen and a cover window.

The sealing portion 125 is formed between the substrate 101 and the encapsulation portion 102. The sealing portion 125 is formed in the cell seal area CSA. The sealing portion 125 may be arranged along a circumference of the circuit area CA.

The sealing portion 125 includes glass frit. The glass frit includes a glass powder and oxide powder. A gel-type paste is manufactured by adding organic materials into the glass frit that includes the oxide powder and is calcined at a temperature ranging from about 300° C. to about 500° C. When the glass frit is calcined, the organic materials are vaporized, and the gel-type paste is hardened. As a result, the glass frit may be in a solid form.

Various circuit patterns may be formed in the circuit area CA. For example, a power supply pattern, an electrostatic prevention pattern, and other circuit patterns may be formed.

A circuit wire 123 is formed in the circuit area CA. The circuit wire 123 may include the same material as the first electrode 119. The circuit wire 123 may be electrically connected to the second electrode 121.

The circuit wire 123 is connected to the power wire 124. The power wire 124 may include the same material as the first source electrode 106, the second source electrode 112, the first drain electrode 107, and the second drain electrode 113. The power wire 124 may receive external power. The power wire 124 may have a trilayer structure including, for example, titanium (Ti)/Al/Ti.

The circuit wire 123 and the power wire 124 may be arranged on different layers.

For example, the circuit wire 123 may be formed on the planarization layer 118. The circuit wire 123 may include the same material and be formed through the same process as the first electrode 119. The power wire 124 may be formed on the interlayer insulating layer 114. The power wire 124 may include the same material and be formed through the same process as the first source electrode 106, the second source electrode 112, the first drain electrode 107, and the second drain electrode 113.

At least some portions of the circuit wire 123 may overlap the power wire 124. An end of the circuit wire 123 contacts the power wire 124.

The power wire 124 extends from the circuit area CA toward an edge of the substrate 101 by passing the cell seal area CSA. The power wire 124 may access a pad used to apply power from the outside. The pad may electrically access terminals of an external circuit board.

In this case, since the power wire 124 is formed of a metal layer, the power wire 124 may not be properly coupled to the sealing portion 125 including an insulating material. The power wire 124 may have a plurality of openings 138. An area where the openings 138 are formed corresponds to the sealing portion 125. Since the openings 138 are formed, a raw material of the sealing portion 125 is filled through the openings 138, and thus, adhesion between the power line 124 and the sealing portion 125 may be slightly improved.

On the other hand, the openings 138 have a closed shape, and thus, bubbles may be generated. The generation of bubbles degrades the strength of the display device 100.

Therefore, the openings 138 may be filled with an insulating member 139. The insulating member 139 may include the same material and through the same process as the planarization layer 118. The insulating member 139 is not limited to only one member if the openings 138 are filled with an insulating member. For example, the insulating member 139 may include the same material as the pixel defining layer 122.

As the openings 138 that are patterned are filled with the insulating member 139, penetration of moisture and outgassing may be further prevented in comparison with a case where the openings 138 are not filled with the insulating member 139. As a result, a reduced amount of bubbles may be generated.

The insulating member 139 may cover a metal layer 140.

In particular, the insulating member 139 including polyimide may not well adhere to the sealing portion 125 formed of glass frit. Therefore, the metal layer 140 that may function as a clad is formed on the insulating member 139 by using a material that well adheres to the sealing portion 125. The metal layer 140 may be formed at a location corresponding to a location where the insulating member 139 is formed.

The metal layer 140 may include the same material and be formed through the same process as the first electrode 119 of the OLED. The metal layer 140 may have a trilayer structure in which a transparent conductive layer including, for example, ITO, a reflected layer including, for example, Ag, and a transparent conductive layer including for example, ITO, are stacked.

At least some portions of the metal layer 140 directly contact the power wire 124, and thus, the metal layer 140 has no lifted portions.

The insulating member 139 fills the openings 138 that are patterned on the power wire 124 and is covered with the metal layer 140. Accordingly, a minimum number of bubbles are generated, and the adhesion between the power line 124 and the sealing portion 125 may be improved.

One or more gate wires may be arranged on a lower portion of the power wire 124. The gate wires include a first gate wire 136 and a second gate wire 137. The first gate wire 136 and the second gate wire 137 may pass the lower portion of the sealing portion 125. Data signals may be sequentially transmitted to the first gate wire 136 and the second gate wire 137 due to scanning signals, light-emitting control signals are transmitted to the first gate wire 136 and the second gate wire 137, or initialization power may be applied to the same.

The first gate wire 136 and the second gate wire 137 may sequentially receive data signals due to scanning signals, receive light-emitting control signals The first gate wire 136 may be formed on the first insulating layer 141. The first gate wire 136 may include the same material and be formed through the same process as the second gate electrode 111. The first insulating layer 141 may be substantially the same as the first gate insulating layer 108. The second insulating layer 142 may cover the first gate wire 136. The second insulating layer 142 may be substantially the same as the second gate insulating layer 109.

The second gate wire 137 may be formed on the second insulating layer 142. The second gate wire 137 may include the same material and be formed through the same process as the first gate electrode 105. The second gate wire 137 is covered with a third insulating layer 143. The third insulating layer 143 may be substantially the same as the interlayer insulating layer 114.

The first gate wire 136 and the second gate wire 137 may be arranged on different layers due to the first through third insulating layers 141 through 143. The first and second gate wires 136 and 137 may be not overlapping with each other.

Since the first and second gate wires 136 and 137 are not formed on the same layer, a distance between the first and second gate wires 136 and 137 which are adjacent to each other may be small.

An edge area EA including a cutting area may be formed outside the cell seal area CSA. The edge area EA includes an area where a plurality of display devices 100 are separated from each other by a cutting process. The reinforcement member 132 may be further formed in the edge area EA. The reinforcement member 132 is used to support the adhesion strength of the sealing portion 125 and may include an adhesive material.

The reinforcement member 132 may include an organic sealant such as, for example, urethane-based resin, epoxy-based resin, and acryl-based resin, or an inorganic sealant such as, for example, silicon. The urethane-based resin may include urethane acrylate, or the like. The acryl-based resin may include butyl acrylate, ethylhexyl acrylate, or the like. In one embodiment, the reinforcement member 132 may include a material that is hardened by heat.

The reinforcement member 132 may be formed by contacting the sealing portion 125 or may be arranged to be spaced apart from the sealing portion 125.

As described above, the display device 100 may reduce the generation of bubbles and improve strength properties as an element that may support the structural strength is arranged between the power wire 124 and the sealing portion 125.

The display device 100 may strengthen the adhesion between the substrate 101 and the sealing portion 125 in the sealing area SA.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A display device comprising:
   a substrate;
   a display disposed on the substrate;
   an encapsulation portion disposed over the substrate; and
   a sealing portion comprising a glass frit arranged between the substrate and the encapsulation portion, and surrounding the display,
   wherein at least one power wire is disposed between the substrate and the encapsulation portion, contacts the sealing portion, and includes a plurality of openings, and wherein an insulating member is disposed in the plurality of openings, and
   wherein a metal layer is disposed between the sealing portion and the at least one power wire.

2. The display device of claim 1, wherein the metal layer covers the insulating member.

3. The display device of claim 2, wherein the metal layer is disposed on a location corresponding to a location where the insulating member is disposed.

4. The display device of claim 1, wherein the at least one power wire directly contacts at least one portion of the metal layer.

5. The display device of claim 1, wherein the substrate comprises an active area where the display is disposed, a circuit area extended outside the active area, and a cell seal area extended outside the circuit area, wherein a circuit wire that is electrically connected to the active area is disposed in the circuit area, and wherein the at least one power wire is electrically connected to the circuit wire and receives external power.

6. The display device of claim 5, wherein the at least one power wire passes a sealing area from the circuit area and is extended to an edge of the substrate.

7. The display device of claim 6, wherein the at least one power wire is arranged on a different layer from the circuit wire, and
   wherein at least some portions of the at least one power wire overlap the circuit wire.

8. The display device of claim 1, wherein the display comprises:
   at least one thin film transistor (TFT) comprising a semiconductor active layer, at least one gate electrode, at least one source electrode, and at least one drain electrode; and
   an organic light-emitting display device (OLED) electrically connected to the at least one TFT and comprising a first electrode, an intermediate layer, and a second electrode, and
   wherein the at least one power wire includes the same material as the at least one source electrode and the at least one drain electrode.

9. The display device of claim 8, wherein the metal layer includes the same material as the first electrode.

10. The display device of claim 8, wherein an insulating layer is disposed between the semiconductor active layer, the at least one gate electrode, the at least one source electrode, and the at least one drain electrode in order to insulate the same.

11. The display device of claim 10, wherein at least one gate wire passes a lower portion of the sealing portion.

12. The display device of claim 11, wherein the at least one gate wire is arranged on a different layer due to the insulating layer.

13. The display device of claim 1, wherein the at least one power wire directly contacts at least some portions of the metal layer.

14. The display device of claim 1, wherein a reinforcement member is further disposed outside the sealing portion.

15. A method of manufacturing a display device, the method comprising:
   forming a substrate;
   forming a display on the substrate;
   covering the substrate with an encapsulation portion;
   arranging a sealing portion comprising a glass frit between the substrate and the encapsulation portion, and surrounding the display; and
   forming a plurality of openings in the at least one power wire, and forming an insulating member in the plurality of openings,
   wherein at least one power wire is disposed between the substrate and the encapsulation portion, and contacts the sealing portion, and
   wherein a metal layer is disposed between the sealing portion and the at least one power wire.

16. The method of manufacturing of claim 15, wherein the at least one power wire directly contacts at least some portions of the metal layer.

17. The method of manufacturing of claim 15 further comprising forming a reinforcement member outside the sealing portion, wherein the reinforcement member comprises a sealant.

18. The method of manufacturing of claim 15, wherein the display comprises:
   at least one thin film transistor (TFT) comprising a semiconductor active layer, a gate electrode, a source electrode, and a drain electrode; and
   an organic light-emitting display device (OLED) electrically connected to the at least one TFT and comprising a first electrode, an intermediate layer, and a second electrode, and
   wherein the at least one power wire includes the same material as the source electrode and the drain electrode.

19. A display device comprising:
   a substrate;
   a display disposed on the substrate, wherein the display comprises:
      at least one thin film transistor (TFT) comprising a semiconductor active layer, at least one gate electrode, at least one source electrode, and at least one drain electrode; and an organic light-emitting display device (OLED) electrically connected to the at least one TFT and comprising a first electrode, an intermediate layer, and a second electrode, and wherein the at least one power wire includes the same material as the at least one source electrode and the at least one drain electrode;

an encapsulation portion disposed over the substrate; and a sealing portion comprising a glass frit arranged between the substrate and the encapsulation portion, and surrounding the display, wherein at least one power wire is disposed between the substrate and the encapsulation portion, and contacts the sealing portion, and wherein a metal layer is disposed between the sealing portion and the at least one power wire.

* * * * *